United States Patent [19]

Jacobson

[11] 4,048,571
[45] Sept. 13, 1977

[54] FREQUENCY DOUBLER

[75] Inventor: Charles L. Jacobson, Pittsford, N.Y.

[73] Assignee: Xerox Corporation, Stamford, Conn.

[21] Appl. No.: 340,491

[22] Filed: Mar. 12, 1973

[51] Int. Cl.² .................. H03K 1/16; H03B 19/00
[52] U.S. Cl. .......................... 328/20; 307/225 R; 307/271
[58] Field of Search .............. 307/235, 225, 271; 328/20

[56] References Cited
U.S. PATENT DOCUMENTS

| 3,573,638 | 4/1971 | Cox, Jr. et al. | 307/235 X |
| 3,593,156 | 7/1971 | Jordan | 328/20 |
| 3,626,214 | 12/1971 | Wesner | 307/235 R |

Primary Examiner—John Zazworsky

[57] ABSTRACT

Circuitry for doubling the frequency of a periodic input signal. The input periodic wave is applied to a differencing amplifier whose inputs are biased in such a manner that the output signal changes level twice during each half-cycle of the input periodic wave. This changing of level occurs at the same relative points in both half-cycles of the periodic input wave.

6 Claims, 4 Drawing Figures

FREQUENCY DOUBLER

BACKGROUND OF THE INVENTION

This invention relates to clock generating circuits and, more particularly, to frequency doubling circuitry.

In the prior art, in order to double the frequency of a periodic signal, nonlinear devices or transformers were utilized. In addition, high precision components were required. Besides the disadvantage that the costs of transformers, non-linear devices and high precision components are quite high, accurate frequency doubling was often difficult to achieve.

SUMMARY OF THE INVENTION

In accordance with the principles of this invention, circuitry is provided for accepting as an input a periodic signal and providing a binary waveform of twice the original input frequency. This is accomplished without the necessity of utilizing expensive components. The original periodic input is applied to a differencing amplifier whose inputs are biased in such a manner that the output signal of the differencing amplifier changes level twice during each half-cycle of the input periodic wave. This changing of level occurs at the same relative point in both half-cycles of the periodic input wave.

DESCRIPTION OF THE DRAWING

The foregoing will become more readily apparent upon reading the foregoing description in conjunction with the drawing in which.

DESCRIPTION OF THE ILLUSTRATIVE EMBODIMENT

Figure 1:
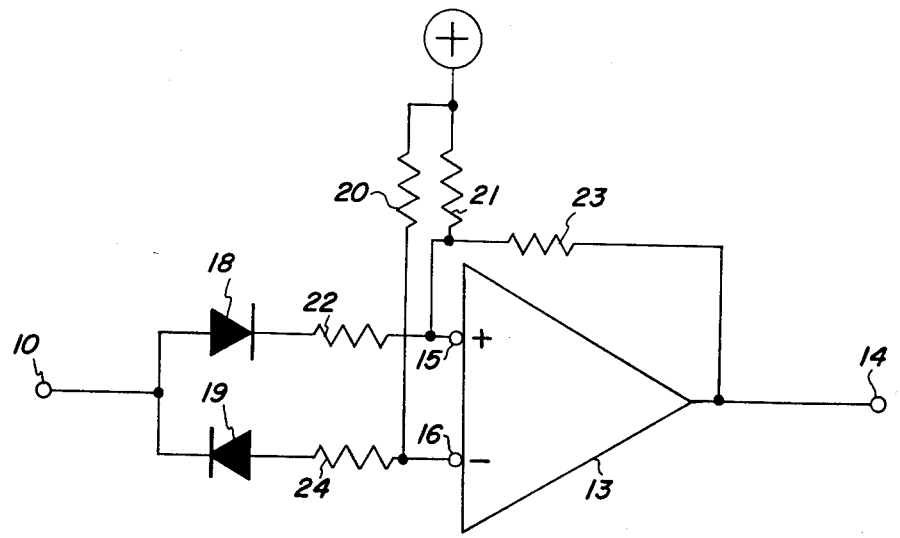
FIG. 1 depicts a schematic diagram of an illustrative circuit embodying the principles of this invention.
Figure 2A:
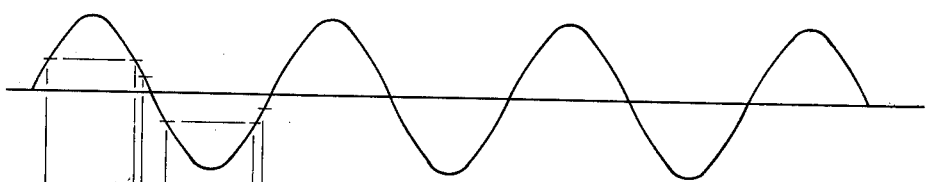
FIGS. 2(a) through 2(c) depict illustrative time related voltage waveforms at different points in the circuit of FIG. 1.

Turning now to FIG. 1, a periodic input signal, illustratively a sinusoid as shown in FIG. 2(a), is applied to terminal 10. Frequency doubling is performed by amplifier 13 which may illustratively be a current differencing amplifier such as the LM 3900 manufactured by National Semiconductor or the MC 3401 manufactured by Motorola. If desired, a voltage differencing, or operational, amplifier may instead be utilized. Current differencing amplifier 13 is biased to produce a binary signal at its output terminal 14 whose state depends upon the relative currents applied to its input terminals 15 and 16. The logic notation to be used in the following discussion is positive logic where a logic ZERO denotes a ground and logic ONE denotes a positive voltage level. A ZERO appears at output terminal 14 if there is more current into negative input terminal 16 than into positive input terminal 15 and there is a ONE at output terminal 14 if there is more current into positive input terminal 15 than into negative input terminal 16.

Figure 2B:
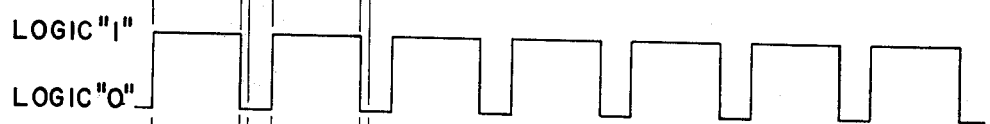

The frequency doubling takes place as follows. First consider the voltage at terminal 10 to be zero volts. Under this condition neither of diodes 18 nor 19 will be forward biased. Resistor 20 is chosen to have a smaller value than resistor 21. Therefore, with neither of the diodes 18 or 19 forward biased, more current will flow through resistor 20 into negative terminal 16 than will flow through resistor 21 into positive terminal 15, causing the output at terminal 14 to be ZERO. As the input voltage swings positive with its sinusoidal waveform, diode 18 becomes forward biased and diode 19 becomes reverse biased. The current into terminal 15 will then be the sum of the currents through resistor 21 and resistor 22. The current into terminal 16 will remain the same as previously. As the input voltage swings more positive, more current will flow through resistor 22. When the total current into terminal 15 becomes greater than the current into terminal 16, the output of amplifier 13 will switch to ONE. The waveform of the output of amplifier 13 is depicted in FIG. 2(b) in an idealized fashion. The output of amplifier 13 remains at ONE while the input voltage increases. As the input voltage passes its peak and starts to decrease, the output of amplifier 13 remains at ONE until the input voltage decreases to the same level as when the output of amplifier 13 switched from ZERO to ONE. Ignoring for the moment the effect of feedback resistor 23, at this time the output of amplifier 13 will switch to ZERO. As the input voltage goes negative, diode 18 will become reverse biased and diode 19 will become forward biased. Current will then flow away from terminal 16 through resistor 24. When enough current is drawn away from terminal 16 so that the current into terminal 15 becomes greater than that into terminal 16, the output of amplifier 13 will again switch to ONE. The output of amplifier 13 will remain at ONE while the input sinusoidal signal passes its negative peak. When the sinusoidal input signal becomes increasingly less negative so that the current drawn away from terminal 16 through resistor 24 is again small enough so that the current into terminal 15 is less than that into terminal 16, the output of amplifier 13 will switch back to ZERO. The cycle then repeats.

Figure 2C:
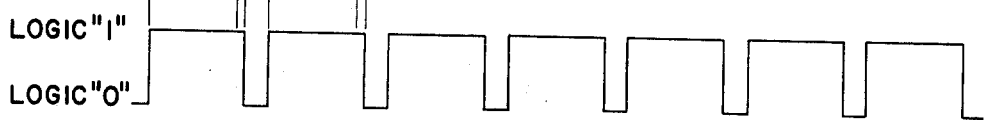

The foregoing description has completely ignored the presence of feedback resistor 23. This resistor provides positive feedback which increases noise immunity and switching speed. It provides a hysteresis effect by delaying the change of the output of amplifier 13 from ONE to ZERO so that this switching actually takes place at a lower absolute value of the input voltage than an output change from ZERO to ONE. The presence of feedback resistor 23 also increases the switching speed from ZERO to ONE. Therefore, noise will not cause the output signal to jump. FIG. 2(c) depicts the effect of the addition of resistor 23 as a positive feedback element. Note that switching from ONE to ZERO occurs later in the cycle when resistor 23 is included than when it is not.

Symmetry is achieved by choosing biasing resistance values so that switching of the output of amplifier 13 from ZERO to ONE and ONE to ZERO takes place at the same relative points during both the positive and negative swings of the input sinusoidal signal. In one example, where the input is a 2.7 volt RMS 60 Hz signal and amplifier 13 is National Semiconductor model LM 3900, the resistance values were chosen to be as follows:

| Resistor | Value (K ohms) |
|---|---|
| 20 | 220 |
| 21 | 1800 |
| 22 | 47 |
| 23 | 470 |
| 24 | 68 |

Accordingly, there has been shown circuitry which generates a binary waveform from a periodic input signal at twice the periodic frequency. It is understood that the above-described arrangement is merely illustrative of the application of the principles of this invention. Numerous other arrangements may be devised by those skilled in the art without departing from the spirit and scope of this invention. For example, as previously mentioned, a voltage differencing amplifier may be substituted for the current differencing amplifier.

What is claimed is:

1. Circuitry for doubling the frequency of a periodic input signal comprising
    a differencing amplifier having a first input terminal, a second input terminal, and an output terminal, said amplifier providing a first signal at said output terminal when said first terminal has a greater applied signal level than said second terminal and providing a second signal at said output terminal when said second terminal has a greater applied signal level than said first terminal,
    biasing means connected to said amplifier input terminals for providing a higher signal level to said second terminal than to said first terminal, said biasing means including
    a single voltage source,
    a first resistor connected between said voltage source and said amplifier first input terminal, and
    a second resistor connected between said voltage source and said amplifier second input terminal, said second resistor having a smaller resistance value than said first resistor, and
    input means connected to said input terminals for increasing the signal level at said first terminal when said input signal is above a predetermined level and for decreasing the signal level at said second terminal when said input signal is below said predetermined level, said input means including
    means for receiving said input signal,
    a first branch adapted to unidirectionally conduct current from said receiving means to said amplifier first input terminal when said input signal is above said predetermined level, and
    a second branch adapted to unidirectionally conduct current from said amplifier second input terminal to said receiving means when said input signal is below said predetermined level.

2. The circuitry of claim 1 further including feedback means connected between said amplifier output terminal and said amplifier first input terminal, said feedback means increasing the signal level at said first input terminal when said first signal is present at said output terminal.

3. The circuitry of claim 1 wherein said first branch includes a first diode having its anode connected to said receiving means and its cathode connected to said amplifier first input terminal and said second branch includes a second diode having its cathode connected to said receiving means and its anode connected to said amplifier second input terminal.

4. Circuitry for doubling the frequency of a periodic input signal comprising
    a current differencing amplifier having a first input terminal, a second input terminal, and an output terminal, said amplifier providing a first signal at said output terminal when the current into said amplifier is greater at said first terminal than at said second terminal and providing a second signal at said output terminal when the current into said amplifier is greater at said second terminal than at said first terminal,
    current providing means connected to said amplifier input terminals for providing more current to said amplifier at said second terminal than at said first terminal, said current providing means including
    a single voltage source,
    a first resistor connected between said voltage source and said amplifier first input terminal, and
    a second resistor connected between said voltage source and said amplifier second input terminal, said second resistor having a smaller resistance value than said first resistor, and
    input means connected to said input terminals for providing current to said amplifier at said first terminal when said input signal is above a predetermined level and for drawing current from said amplifier at said second terminal when said input signal is below said predetermined level, said input means including
    means for receiving said input signal,
    a first branch adapted to unidirectionally conduct current from said receiving means to said amplifier first input terminal when said input signal is above said predetermined level, and
    a second branch adapted to unidirectionally conduct current from said amplifier second input terminal to said receiving means when said input signal is below said predetermined level.

5. The circuitry of claim 4 further including feedback means connected between said amplifier output terminal and said amplifier first input terminal, said feedback means increasing the current into said amplifier at said first input terminal when said first signal is present at said output terminal.

6. The circuitry of claim 4 wherein said first branch includes a first diode having its anode connected to said receiving means and its cathode connected to said amplifier first input terminal and said second branch includes a second diode having its cathode connected to said receiving means and its anode connected to said amplifier second input terminal.

* * * * *